US006535063B1

(12) United States Patent
Gibson et al.

(10) Patent No.: US 6,535,063 B1
(45) Date of Patent: Mar. 18, 2003

(54) DRIVE METHOD FOR A CROSS-CONNECTED CLASS AB OUTPUT STAGE WITH SHARED BASE CURRENT IN PRE-DRIVER

(75) Inventors: Neil Gibson, Freising (DE); Marco Corsi, Parker, TX (US); Tobin Hagan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/005,112

(22) Filed: Dec. 3, 2001

(51) Int. Cl.[7] ................................ H03F 3/18
(52) U.S. Cl. .................. 330/263; 330/267; 330/268
(58) Field of Search ........................ 330/263, 267, 330/268, 288

(56) References Cited

U.S. PATENT DOCUMENTS 6,278,326 B1 * 8/2001 Murray et al. .............. 330/288

FOREIGN PATENT DOCUMENTS

JP          36051012      * 3/1985

OTHER PUBLICATIONS

Trask "High Efficiency Broadband Linear Push–Pull Power Amplifiers Using Linearity Augmentation" IEEE Symposium on Circuits and Systems vol. 2, 2002 pp 432–435.*

* cited by examiner

Primary Examiner—Michael B Shingleton
(74) Attorney, Agent, or Firm—W. Daniel Swayze, Jr.; W. James Brady; Frederick J. Telecky, Jr.

(57) ABSTRACT

The present invention provides technical advantages as a class AB output driver (400) with minimal cross-over distortion. If the differential input to the driver is $I+\delta I/2$ and $I-\delta I/2$, then the current gain is the average of $\beta_n$ and $\beta_p$, more specifically, $(\beta_n-\beta_p)*I+((\beta_n+\beta_p)/2)* \delta I$. The offset current $(\beta_n-\beta_p)*I$ is taken out with a feedback loop.

20 Claims, 4 Drawing Sheets

DRIVE METHOD FOR A CROSS-CONNECTED CLASS AB OUTPUT STAGE WITH SHARED BASE CURRENT IN PRE-DRIVER

FIELD OF THE INVENTION

Generally, this invention relates to amplifiers, and in particular to class AB operational amplifier driver stages.

BACKGROUND OF THE INVENTION

Many electronic circuits use amplifiers to manipulate various signals within the circuit. The output of the amplifier may be connected to provide an output voltage to a load circuit. The design of the output stage may affect various operating aspects of the amplifier. For example, some amplifiers can deliver a high output current to the load. Other amplifiers can produce an output voltage swing that is approximately equal to the magnitude of the power supply for the amplifier circuit. Some amplifiers must provide an output that has a low crossover distortion. Yet other amplifiers are required to maintain gain and stability at relatively high frequencies. Each of these requirements places constraints upon the design of the output stage.

During operation, an amplifier circuit consumes current from a power supply. A portion of this current, known as the quiescent current, is used to bias the internal circuitry of the amplifier. A low quiescent current is desirable because it reduces the power consumption when the amplifier is operable at a light load, or with no load at all.

Previously developed amplifier output circuits have addressed some of these problems. For example, output circuits commonly referred to as class A circuits provide low output distortion. Unfortunately, class A circuits inherently consume large amounts of quiescent current. A second class of output circuits is referred to as class B circuits. These circuits consume very little quiescent current. However, class B circuits exhibit substantial crossover distortion. A hybrid of the class A and Class B output circuits is commonly referred to as class AB output circuits. Class AB circuits consume more quiescent current than equivalent class B circuits, but less quiescent current than equivalent class A circuits. As a result, they exhibit less crossover distortion than class B circuits but more crossover distortion than class A circuits.

Most amplifiers use class AB output circuits so as to achieve reasonable crossover distortion levels with a quiescent current of perhaps five to ten percent of the maximum allowable output current. These circuits typically have difficulty in achieving significantly lower levels of quiescent current. In addition, many prior amplifier circuits rely upon circuits which reduce the availability frequency response to reduce the quiescent current.

SUMMARY OF THE INVENTION

The present invention achieves technical advantages as a six (6) transistor class AB output driver with minimal cross-over distortion. The output stage comprises a core of 4 transistors arranged such that the current gain from input to output is the average of $\beta_n$ and $\beta_p$, irrespective of where the stage is biased. Two cascode transistors serve to bootstrap the collector-base capacitances for speed enhancement.

BRIEF DESCRIPTION OF THE DRAWINGS

FIGS. 1 through 3 correlate to FIG. 7 and are represented by the curve which transitions between 260 and 190;

DESCRIPTION OF CONVENTIONAL DRIVER CIRCUITS

Figure 1:
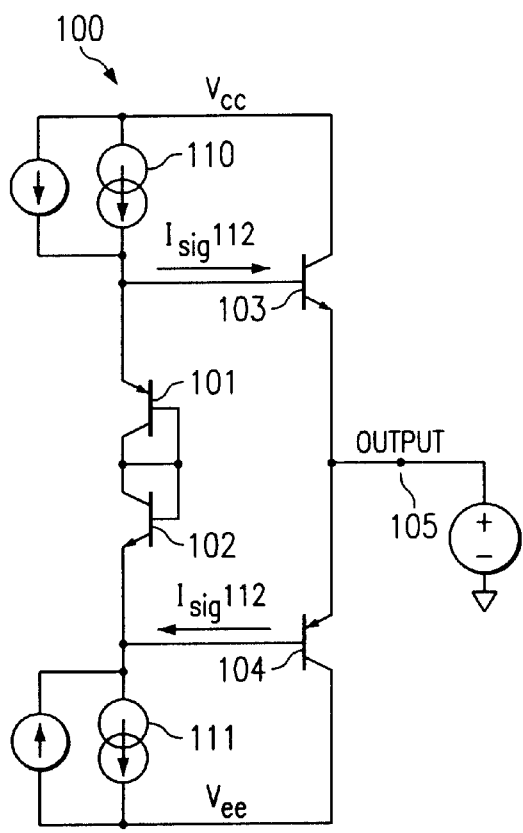
FIG. 1 is a circuit diagram of a first existing output driver.
Figure 2:
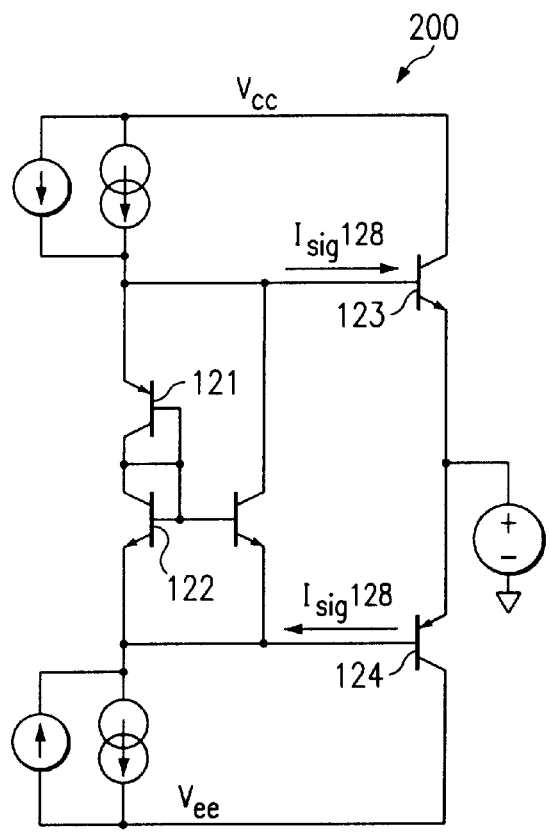
FIG. 2 is a circuit diagram of a second existing output driver.
Figure 3:
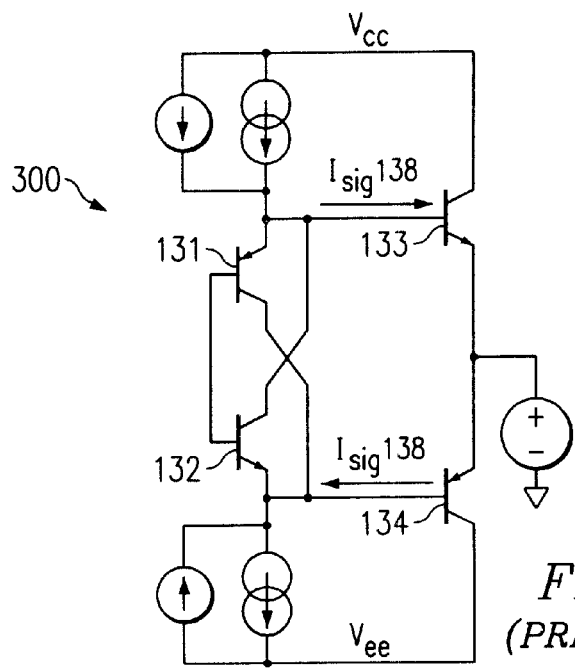
FIG. 3 is a circuit diagram of a third existing output driver.

FIGS. 1, 2 and 3 illustrate three (3) existing output driver circuit topologies. Each of these circuits operate in essentially the same manner. The method of input drive is by R differential current. A significant disadvantage of the circuit 100 of FIG. 1 is that the transistors 101 and 102 share the same collector current. This forces the signal current 112 to flow entirely into the bases of transistors 103 and 104. This similarly happens in the circuits of FIGS. 2 and 3. In the circuit 200 of FIG. 2, transistors 121 and 122 share the same collector current. This forces the signal current 128 to flow entirely into the bases of transistors 123 and 124. In the circuit 300 of FIG. 3, transistors 131 and 132 share the same collector current. This forces the signal current 138 to flow entirely into the bases of transistors 133 and 134.

Figure 5:
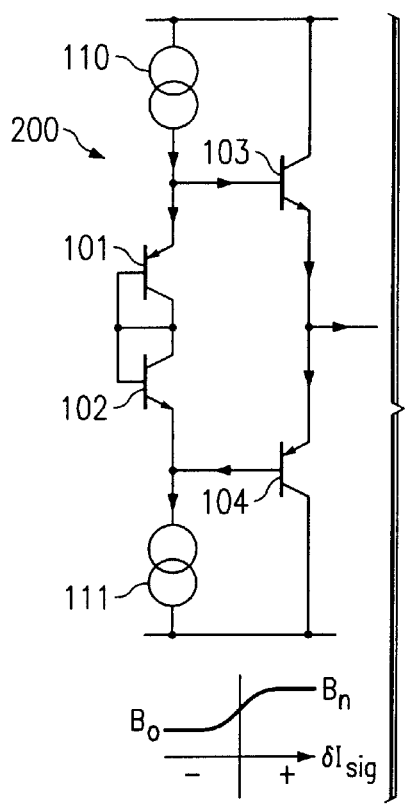
FIG. 5 is a DC transfer analysis of the output driver of FIG. 1.
Figure 6:
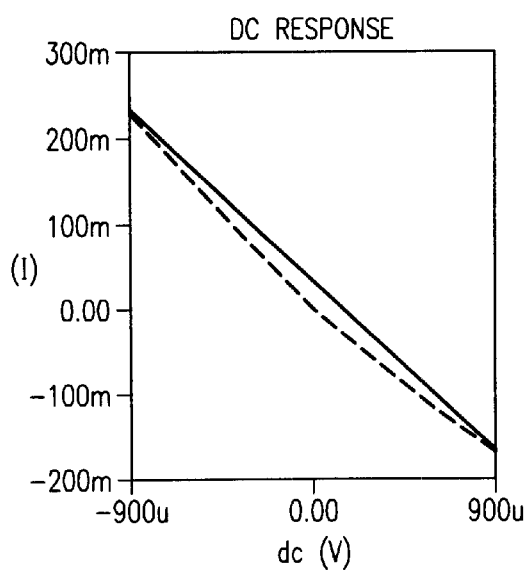
FIG. 6 represents the transfer characteristic of the output drivers of FIGS. 1 through 4. The characteristics of output drivers in FIGS. 1 through 3 are superimposed and are shown by the bent line. The straight line is the transfer characteristic of FIG. 4.

Referring back to FIG. 1, when the signal current 112 is large and positive, it will flow entirely into transistor 103, where the gain to the load at 105 is $\beta_{n103}$. $\beta_{n103}$ refers to the current gain of the npn transistor 103. When the signal current 112 is large and negative, it will flow entirely into transistor 104, where the gain to the load is $\beta_{p104}$. $\beta_{p104}$ refers to the current gain of the pnp transistor 104. As the signal current flows from positive to negative the gain will change from $\beta_{n103}$ to $\beta_{p104}$ giving rise to crossover distortion. FIG. 5 shows the DC transfer characteristics of the circuit of FIG. 1.

Referring to FIG. 1, input current to the output driver through current source 110 takes the form:

$$I + \frac{\delta I}{2} \qquad 1.$$

Input current to the output driver through current source 111 takes the form:

$$1 - \frac{\delta I}{2} \qquad 2.$$

Signal current 112 into the base of transistor 103 takes the form:

$$\alpha * \delta I \qquad 3.$$

Signal current 113 into the base of transistor 104 takes the form:

$$(\alpha-1) * \delta I \qquad 4.$$

In the case of large $\delta I$ and transistor 103, $\alpha=1$ gain≈$\beta_{n103}$ In the case of large $-\delta I$, and transistor 104, $\alpha=0$ gain≈$\beta_{p104}$ In the case of small $\delta I$, where conduction, $\alpha \approx 0.5$ $$gain \approx \frac{\beta_{n103} + \beta_{p104}}{2}$$

Overall gain≈$\alpha * \beta_{n103} - (\alpha-1)\beta_{p104}$.

DETAILED DESCRIPTION OF THE PRESENT INVENTION

Figure 4:
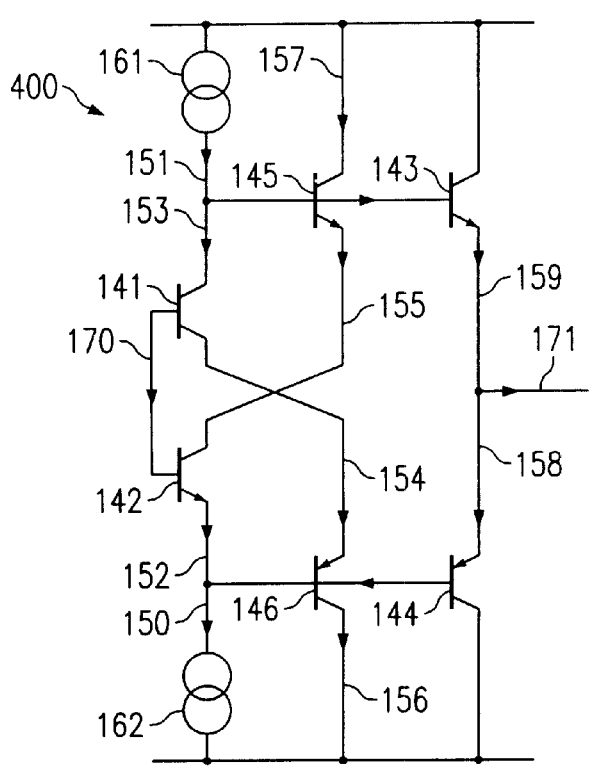
FIG. 4 is a circuit diagram of a six (6) transistor class AB output driver according to the present invention.

The present invention shown at 400 in FIG. 4 is an output driver advantageously comprising a core of four (4) transistors 141, 142, 143, and 144 arranged in a cross-connected manner such that the current gain from input of the driver 400 to the output of the driver 400 is the average of the $\beta_n$ and $\beta_p$ irrespective of where the driver is biased, as illustrated below.

This output driver 400 allows an escape path for the current flowing through the collectors of the transistors 141 and 142, such that the collectors thereof do not share the same collector current. This new path overcomes the disadvantages of the circuits illustrated in FIGS. 1, 2 and 3, as previously described.

Transistors 142 and 141 share the same base current $i_b$ through branch 170. Their emitter currents are respectively $\beta_p * i_b$ through branch 153 and $\beta_n * i_b$ through branch 152, where $i_b$ is the small signal current.

The input current drive at the high-side through branch 151 is $$\left(I + \frac{\delta I}{2}\right),$$

and thus the current in the base of transistor 143 is:

$$I + \frac{\delta I}{2} - \beta_p * i_b.$$

Thus the emitter current of transistor 143 is $$\beta_n * I + \beta_n * \frac{\delta I}{2} - \beta_n * \beta_p * i_b.$$

The input current drive at the low-side through branch 150 is:

$$\left(I - \frac{\delta I}{2}\right),$$

and thus the current in the base of transistor 144 is:

$$I - \frac{\delta I}{2} - \beta_n * i_b.$$

Thus the emitter current of transistor 144 is:

$$\beta_p * I - \beta_p * \frac{\delta I}{2} - \beta_n * \beta_p * i_b.$$

Current approximately equal to $\beta_n * i_b$ flows through branch 157 through the collector of transistor 145 and current approximately equal to $\beta_p * i_b$ flows through branch 156 into the collector of transistor 146. Approximately $\beta_p * i_b$ flows through branch 154 into the emitter of transistor 146 and approximately $\beta_n * i_b$ flows through branch 155 into the collector of transistor 142.

The current through branch 159 is:

$$\beta_n * I + \beta_n * \frac{\delta I}{2} - \beta_n * \beta_p * i_b$$

The current through branch 158 is:

$$\beta_p * I - \beta_p * \frac{\delta I}{2} - \beta_n * \beta_p * i_b$$

Thus, the two emitter currents from transistor 143 and transistor 144 sum in branch 171 giving rise to the load current which is $(\beta_n - \beta_p) * I + ((\beta_n + \beta_p)/2) * \delta I$. Hence the current gain is the average of the pnp beta and the npn beta. The offset term $\beta_n - \beta_p * i_b$ is removed in a feedback loop.

Advantageously, transistors 145 and 146 serve to bootstrap the collector-base capacitance of transistors 141 and 142 respectively. This gives AC performance comparable to that of the existing output drivers 100, 200 and 300 of FIGS. 1, 2 and 3.

Figure 7:
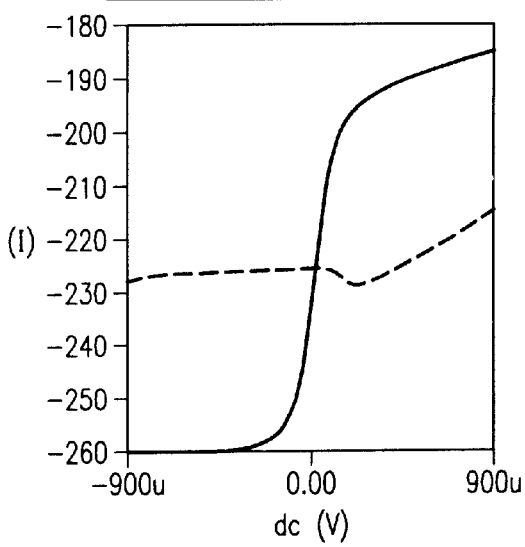
FIG. 7 represents the derivative of the transfer characteristics of FIG. 6 and is an illustration of linearity for output drivers of FIGS. 1, 2 and 3 with that of FIG. 4.
Figure 8:
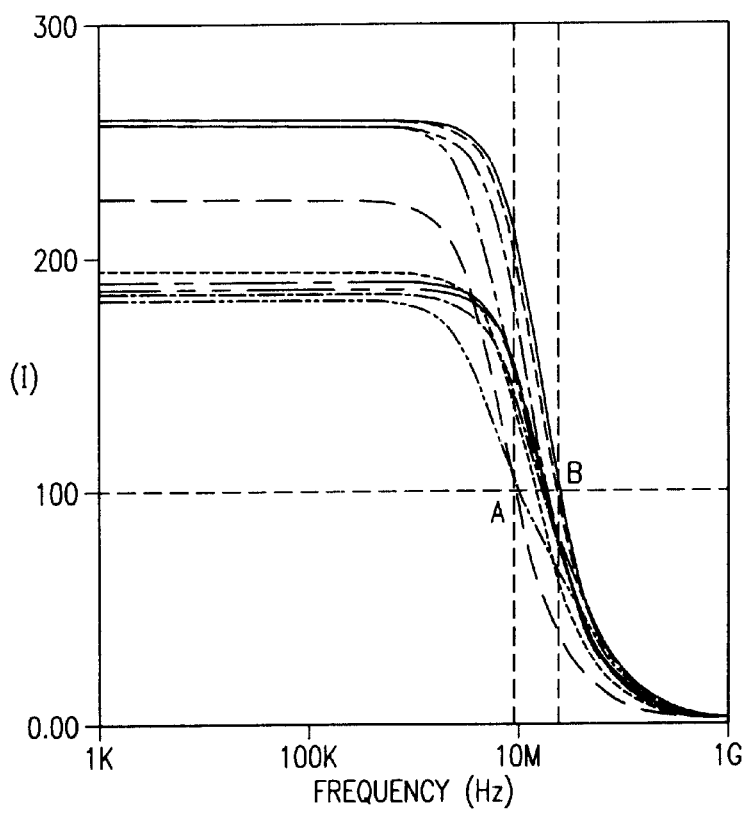
FIG. 8 is a typical output waveform showing frequency response of the output driver of FIG. 1 for different bias points.
Figure 9:
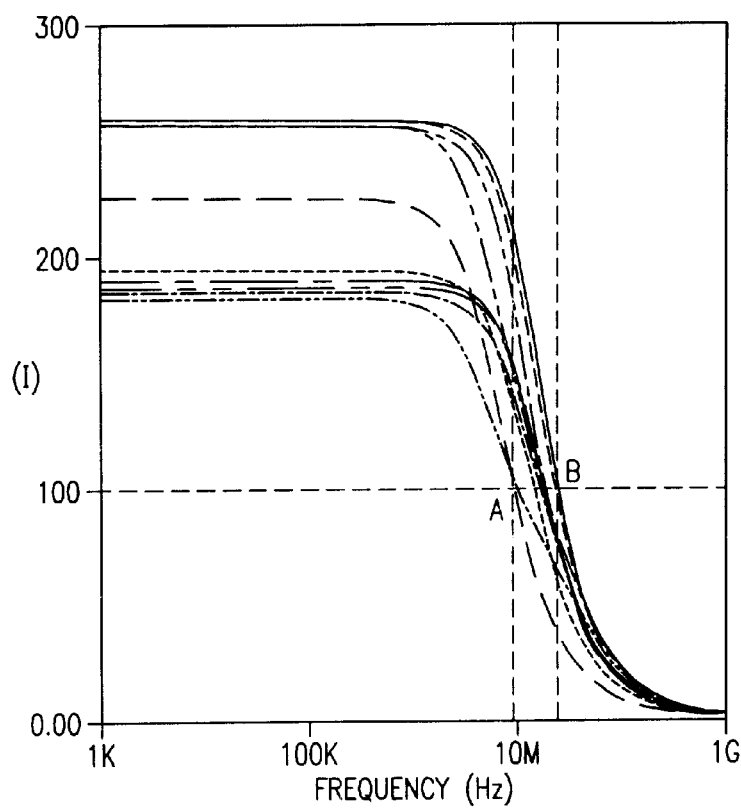
FIG. 9 is a typical output waveform showing frequency response of the output driver of FIG. 2 for different bias points.
Figure 10:
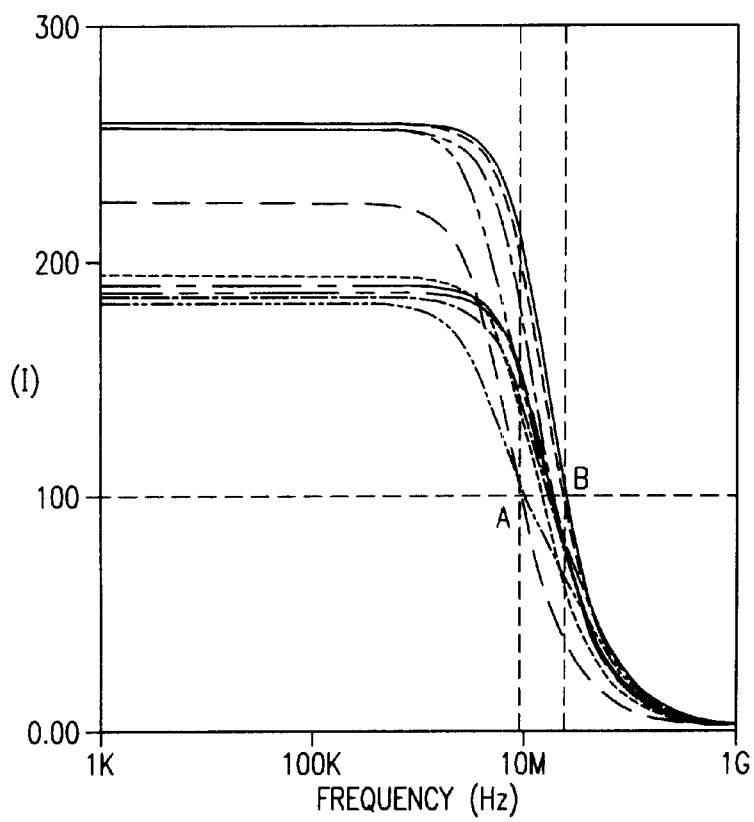
FIG. 10 is a typical output waveform showing frequency response of the output driver of FIG. 3 for different bias points.
Figure 11:
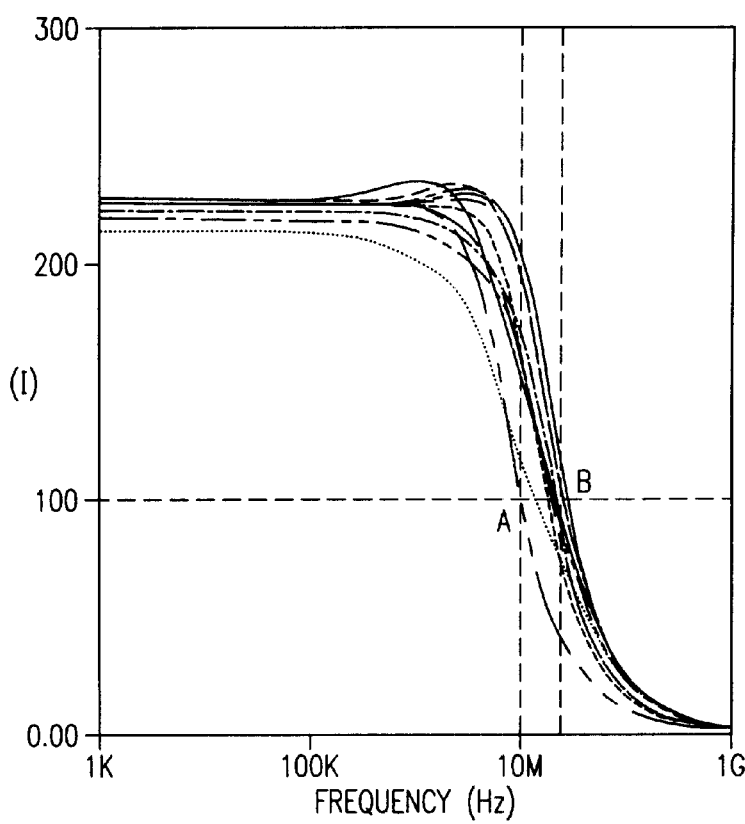
FIG. 11 is a typical output waveform showing frequency response of the output driver of FIG. 4.

The present invention results in a reduction in open-loop crossover distortion by a factor of between 10 and 20. FIG. 7 shows the significant improvement in DC transfer characteristic of the present invention over the existing output drivers. FIGS. 8, 9 and 10 show the AC response for the output drivers 100, 200, and 300 of FIGS. 1, 2 and 3, respectively. FIG. 11 shows the AC response of the present invention. Each of the output drivers 100, 200, 300, and 400 shown in FIGS. 1, 2, 3 and 4, respectively, have comparable pole frequencies, but the output driver of FIG. 4 has a tighter spread of AC gain.

The innovative teachings of the present application are described with particular reference to the disclosed embodiment. However, it should be understood that this embodiment provides only one example of the many advantageous uses and innovative teachings herein. Various alterations, modifications and substitutions can be made to the disclosed invention without departing in any way from the spirit and scope of the present invention, as defined in the claims that follow. For example, although the embodiment has been presented with reference to particular transistor types, voltage and current polarities, and methods of coupling, the present inventive structures and characteristics are not necessarily limited to such particular transistor types, polarities, or methods of coupling as used herein. It should be understood the embodiment used hereinabove can easily be implemented using many diverse transistor types, polarities and methods of coupling so long as the combinations achieve an output of $(\beta_n-\beta_p)*I+((\beta_n+\beta_p)/2)*\delta I$ with minimal cross-over distortion, with the term $\beta_n-\beta_p)*I$ removed in a feedback circuit.

What is claimed is:

1. An output stage driver, comprising:
    a plurality of transistors biased class AB operable to provide current gain from input to output of $(\beta_n-\beta_p)*I+((\beta_n+\beta_p)/2)*\delta I$ regardless of where the output stage is biased, where $\delta I$ is the time varying signal current.

2. The output stage driver recited in claim 1 further comprising a feedback circuit operable to remove the term $(\beta_n-\beta_p*I)$ from the output.

3. The output stage driver recited in claim 1 being configured in an integrated circuit.

4. The output stage driver recited in claim 1 being configured in a DSL line driver.

5. The output stage driver recited in claim 1 being adapted to provide minimal cross-over distortion.

6. An output stage driver, comprising:
    a first circuit including a first transistor, a second transistor, a third transistor and a fourth transistor operable in a class AB biasing arrangement;
    a second circuit including a sixth transistor cross-coupled with the first transistor and a fifth transistor cross-coupled with the second transistor operable to allow different amounts of collector circuit to flow through the first transistor and second transistor;
    the first transistor, fourth transistor and sixth transistor comprising pnp transistors;
    the second transistor, third transistors and fifth transistor comprising npn transistors; and
    the first circuit and second circuit being adapted to provide gain from input to output of the average of $\beta_n$ and $\beta_p$.

7. The output stage driver recited in claim 6 being configured in an integrated circuit.

8. The output stage driver recited in claim 6 being configured in a DSL line driver.

9. An output stage driver, comprising:
    a circuit including a first transistor, a second transistor, a third transistor and a fourth transistor operable in a class AB biasing arrangement;
    a circuit coupling the first transistor to a sixth transistor in a cascode arrangement;
    a circuit coupling the second transistor to a fifth transistor in a cascode arrangement;
    the fifth transistor and the sixth transistor being operable to bootstrap the collector-base capacitances of the second transistor and the first transistor, respectively; and
    the first transistor, second transistor, third transistor, fourth transistor, fifth transistor and sixth transistor being operable to drive a load with minimal cross-over distortion with an output gain to input signal of $(\beta_n-\beta_p)*I+((\beta_n+\beta_p)/2)$.

10. The output stage driver recited in claim 9, further comprising a feedback circuit operable to remove the term $(\beta_n-\beta_p)*I$ from the output.

11. The output stage driver recited in claim 9 being configured in an integrated circuit.

12. The output stage driver recited in claim 9 being configured in a DSL line driver.

13. An output stage driver, comprising:
    a first voltage rail VCC being coupled to a first terminal of a first current source;
    a second terminal of the first current source being coupled to each of the emitter of a first transistor, the base of a fifth transistor and to the base of a third transistor;
    the base of the first transistor being coupled to the base of a second transistor;
    the collector of the first transistor being coupled to the emitter a sixth transistor in a cascode arrangement;
    the collector of the second transistor being coupled to the emitter of the fifth transistor in a cascode arrangement;
    the emitter of the second transistor being coupled to each of the base of the sixth transistor, the base of a fourth transistor and a first terminal of a second current source;
    a second terminal of the second current source being coupled to a second voltage rail $V_{ee}$;
    the collector of the fifth transistor being coupled to the first voltage rail $V_{cc}$; the collector of the third transistor being coupled to the first voltage rail $V_{cc}$;
    the collector of the sixth transistor being coupled to the second voltage rail $V_{ee}$;
    the collector of the fourth transistor being coupled to the second voltage rail $V_{ee}$;
    the emitter of the third transistor being coupled to the emitter of the fourth transistor; and
    an output terminal being coupled to a node connecting the emitter of the third transistor and the emitter of the fourth transistor.

14. The output stage driver recited in claim 13, further comprising the first, fourth and sixth transistors being pnp transistors and the second, third and fifth transistors being npn transistors.

15. The output stage driver recited in claim 13, being operable to provide current gain from input to output of $(\beta_n-\beta_p)*I+((\beta_n+\beta_p)/2)*\delta I$ regardless of where the output stage driver is biased.

16. The output stage driver recited in claim 15, further comprising a feedback circuit operable to remove the term $(B_n-B_p)*I$ from the output.

17. The output stage drive recited in claim 13, wherein the first voltage rail $V_{cc}$ is maintained at a potential higher than the second voltage rail $V_{ee}$.

18. The output stage driver recited in claim 13, being configured in an integrated circuit.

19. The output stage driver recited in claim 13, being configured in a DSL line driver.

20. A method of amplifying a signal ($\delta I$) in an output stage driver, comprising:
    biasing a plurality of transistors in the output stage driver class AB;
    injecting the signal into the output stage driver by altering the magnitudes of the signal in equal but opposite quantities;
    amplifying the injected signal using a plurality of transistors;
    outputting the amplified signal gained by $(\beta_n-\beta_p)*I+((\beta_n+\beta_p)/2)$, where $\beta_n$ is the beta of an npn transistor and $\beta_p$ is the beta of a pnp transistor; and
    sensing and correcting offset current at the output using feedback principles.

* * * * *